(12) United States Patent
Masuda et al.

(10) Patent No.: US 7,750,360 B2
(45) Date of Patent: Jul. 6, 2010

(54) SOLID-STATE IMAGE PICKUP DEVICE

(75) Inventors: Tomoki Masuda, Osaka (JP); Yasuo Takeuchi, Osaka (JP); Tomoko Komatsu, Kyoto (JP); Tsuyoshi Ichinose, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/186,157

(22) Filed: Aug. 5, 2008

(65) Prior Publication Data
US 2009/0039454 A1 Feb. 12, 2009

(30) Foreign Application Priority Data
Aug. 6, 2007 (JP) ............... 2007-204236

(51) Int. Cl.
| H01L 29/22 | (2006.01) |
| H01L 29/227 | (2006.01) |
| H01L 33/00 | (2006.01) |
| H01L 27/14 | (2006.01) |
| H01L 31/00 | (2006.01) |
| H01L 31/0203 | (2006.01) |
| H01L 31/0232 | (2006.01) |

(52) U.S. Cl. .................. 257/98; 257/431; 257/434; 257/437; 257/443; 257/E33.06; 257/E33.068; 257/E33.073

(58) Field of Classification Search ............. 257/98, 257/431, 437, 443, E33.06, E33.068, E33.073, 257/434
See application file for complete search history.

(56) References Cited

U.S. PATENT DOCUMENTS

| 6,122,417 | A * | 9/2000 | Jayaraman et al. ............ 385/24 |
| 6,171,885 | B1 * | 1/2001 | Fan et al. ...................... 438/70 |
| 6,274,917 | B1 * | 8/2001 | Fan et al. ...................... 257/432 |
| 6,707,612 | B2 * | 3/2004 | Ohtsu et al. ................... 359/620 |
| 7,042,645 | B2 * | 5/2006 | Houlihan et al. ............. 359/619 |
| 7,084,472 | B2 | 8/2006 | Fukuyoshi et al. |
| 7,264,976 | B2 * | 9/2007 | Deng et al. ..................... 438/7 |
| 7,298,955 | B2 * | 11/2007 | Kooriyama ................. 385/146 |
| 7,393,715 | B2 * | 7/2008 | Tazoe et al. .................... 438/57 |
| 7,511,750 | B2 * | 3/2009 | Murakami ................... 348/294 |
| 2004/0185588 | A1 * | 9/2004 | Fukuyoshi et al. ............ 438/22 |
| 2006/0082886 | A1 * | 4/2006 | Yakushiji et al. ............. 359/620 |
| 2006/0145223 | A1 * | 7/2006 | Ryu ............................ 257/294 |

(Continued)

FOREIGN PATENT DOCUMENTS

JP 04259256 A * 9/1992

(Continued)

Primary Examiner—Ida M Soward
(74) Attorney, Agent, or Firm—McDermott Will & Emery LLP

(57) ABSTRACT

Provided is a solid-state image pickup device capable of suppressing deterioration of characteristic caused due to an antireflection film itself absorbing a light. In the solid-state image pickup device of the present invention, a plurality of color filters 8a, 8b, and 8c having spectral characteristics, respectively, different from each other are provided so as to correspond to a plurality of light reception sections 2, respectively, aligned on a semiconductor substrate 1. Further, a plurality of microlenses 10 are provided above the plurality of color filters 8a, 8b, and 8c, respectively. A plurality of antireflection films 11a are selectively formed on surfaces of the microlenses 10 provided above color filters 8b each having a predetermined spectral characteristic.

15 Claims, 12 Drawing Sheets

U.S. PATENT DOCUMENTS

| | | | |
|---|---|---|---|
| 2006/0197097 A1* | 9/2006 | Mori | 257/89 |
| 2006/0221800 A1* | 10/2006 | Takahashi et al. | 369/120 |
| 2007/0152251 A1* | 7/2007 | Park | 257/294 |
| 2008/0042227 A1* | 2/2008 | Asano et al. | 257/432 |
| 2008/0049165 A1* | 2/2008 | Min et al. | 349/64 |

FOREIGN PATENT DOCUMENTS

| | | |
|---|---|---|
| JP | 2719238 | 2/1998 |
| JP | 2000156486 A * | 6/2000 |
| JP | 2005-316111 | 11/2005 |

\* cited by examiner

FIG.2

| G | R | G | R |
|---|---|---|---|
| B | G | B | G |
| G | R | G | A R |
| A B | G | B | G |

FIG.3

| Cy | Y | Cy | Y |
|---|---|---|---|
| Mg | G | Mg | G |
| Cy | Y | Cy | Y |
| Mg | G | Mg | G |

CENTER PORTION
OF PIXEL AREA

EDGE PORTION
OF PIXEL AREA

SOLID-STATE IMAGE PICKUP DEVICE

BACKGROUND OF THE INVENTION

1. Field of the Invention

The present invention relates to a solid-state image pickup device and a fabrication method thereof, and, more particularly, to a solid-state image pickup device having an antireflection film formed on a surface of a microlens, and a fabrication method for fabricating the solid-state image pickup device.

2. Description of the Background Art

Recently, a solid-state image pickup device, which has advantages such as compactness, reduced weight, long-life, reduced persistence of vision, and reduced power consumption, has been rapidly widespread as an image pickup device incorporated in a digital video camera, and a digital still camera.

Some of the solid-state image pickup devices include a microlens made of a transparent material so as to enhance light-collection efficiency. A microlens is typically made of transparent resin such as acrylic resin or polystyrene, and a reflectance of the surface of the transparent resin is about 10%. In order to increasingly enhance the light-collection efficiency, increased reduction of the reflectance has been conventionally sought.

For example, Japanese Patent No. 2719238 discloses a method for forming an antireflection film on a microlens in the Langmuir-Blodgett method (hereinafter, referred to as "LB method"), or the water surface casting method, so as to reduce a reflectance of a surface of a microlens. Hereinafter, a coating method for the antireflection film disclosed in Japanese Patent No. 2719238 will be briefly described with reference to drawings.

FIGS. 16 to 18 are diagrams illustrating process steps of a conventional LB method disclosed in Japanese Patent No. 2719238.

The LB method is applied when a highly-volatile solvent having a low molecular weight is used. The solvent is prepared by substituting fluorine atom for hydrogen atom, in ether or ketone. In this solvent, a fluorine-containing resin (for example, a fluorine-containing epoxy resin, polyester resin, methacrylate resin, or phenolic resin) is dissolved such that the concentration of the obtained solution is smaller than or equal to 10% (preferably, smaller than or equal to 5%).

When the fluororesin solution obtained through the preparation described above is dropped onto water surface, a great part of the highly volatile solvent contained in the solution evaporates, and the fluorine-containing resin remains on the water surface as a monomolecular film as shown in FIG. 16. Surface pressure is sufficiently applied, to the monomolecular film remaining on the water surface, by using a floating element and a weight so as to obtain a solid film.

Further, as shown in FIG. 17, a substrate, such as a wafer or a chip, is moved up and down through the water surface so as to transfer the monomolecular film onto the substrate. As a result, a surface of a microlens on the substrate can be coated with a fluorine-containing resin film (antireflection film). Further, as shown in FIG. 18, the antireflection film having a desired film thickness can be formed by repeating the up and down movement of the substrate.

Further, a process for removing excess solvent by, for example, applying heat may be performed, as necessary, so as to enhance adherence between the substrate and the fluorine-containing resin film. In the LB method, it is important to appropriately select a type of the fluorine-containing resin and set the concentration so as to obtain a uniform film thickness.

On the other hand, in the water surface casting method, a thin film having the thickness of several tens of nanometers is formed by applying a few drops of fluororesin solution on water surface. Thereafter, as in the LB method, a substrate is moved up and down through the water surface so as to coat a microlens with the thin film (antireflection film). Alternatively, the thin film (antireflection film) may be transferred onto the substrate by moving the horizontally held substrate onto so as to be as close as possible to the thin film on the water surface, and then slightly tilting the substrate such that one edge of the substrate contacts with the thin film.

FIG. 19 is a cross-sectional view of a conventional solid-state image pickup device disclosed in Japanese Laid-Open Patent Publication No. 2005-316111.

Japanese Laid-Open Patent Publication No. 2005-316111 discloses that a transparent resin film is formed so as to entirely embed a plurality of microlenses, as shown in FIG. 19, by using the spin coating method.

SUMMARY OF THE INVENTION

The conventional technique described above has the following problems.

Firstly, according to Japanese Patent No. 2719238, an antireflection film is formed on a microlens in the LB method or the water surface casting method. However, when the method is executed in units of wafers, a problem arises that variation in transfer of the antireflection film occurs among the wafers, and the thickness of the antireflection film on the microlens is different among wafers. Further, when an antireflection film material is attached to the back surface of the wafer, the material may soil a manufacturing device in the following process steps, thereby resulting in reduction of productivity.

Next, Japanese Laid-Open Patent Publication No. 2005-316111 discloses that the antireflection film is formed so as to entirely embed the microlenses such that the thickness of the antireflection film is 0.2 to 0.5 μm on the top of each microlens. Further, it is disclosed that the thickness of the antireflection film is increased so as to improve flatness of the surface of the antireflection film. However, there is a problem that the increase of the thickness of the antireflection film leads to reduction of an amount of light incident on a photodiode due to the antireflection film itself absorbing light, resulting in deterioration of characteristic such as sensitivity and the S/N ratio.

Therefore, an object of the present invention is to provide a solid-state image pickup device for suppressing the deterioration of characteristic caused due to an antireflection film itself absorbing light, and a method for fabricating the solid-state image pickup device with high yield rate.

A first aspect of the present invention is directed to a solid-state image pickup device. The solid-state image pickup device comprises: a semiconductor substrate; a plurality of light reception sections aligned on the semiconductor substrate so as to form a matrix; a plurality of color filters formed above the plurality of light reception sections, respectively; a plurality of microlenses formed above the plurality of color filters, respectively; and a plurality of antireflection films selectively formed on surfaces of a portion of the plurality of microlenses.

In this case, the plurality of antireflection films may be selectively formed on surfaces of microlenses which are formed above color filters, among the plurality of color filters, each having a predetermined spectral characteristic, the microlenses being among the plurality of microlenses.

When the plurality of color filters form a primary color filter alignment including red filters, green filters, and blue filters, the plurality of antireflection films are preferably formed on the surfaces of the microlenses above the red filters, respectively.

Alternatively, when the plurality of color filters form a complementary color filter alignment including cyan filters, magenta filters, yellow filters, and green filters, the plurality of antireflection films are preferably formed on the surfaces of the microlenses above the magenta filters, respectively.

A second aspect of the present invention is directed to a solid-state image pickup device. The solid-state image pickup device comprises: a semiconductor substrate; a plurality of light reception sections aligned on the semiconductor substrate so as to form a matrix; a plurality of color filters formed above the plurality of light reception sections, respectively; a plurality of microlenses formed above the plurality of color filters, respectively; and a plurality of antireflection films formed on surfaces of the plurality of microlenses, respectively, the plurality of antireflection films each having a thickness determined for each microlens.

In this case, the thickness of each antireflection film depends on a spectral characteristic of a corresponding one of the plurality of color filters.

When the plurality of color filters form a primary color filter alignment including red filters, green filters, and blue filters, antireflection films, among the plurality of antireflection films, formed on surfaces of microlenses above the red filters are preferably thicker than antireflection films, among the plurality of antireflection films, formed on surfaces of microlenses above the blue filters, and antireflection films, among the plurality of antireflection films, formed on surfaces of microlenses above the green filters.

Further, the antireflection films formed on the surfaces of the microlenses above the green filters are more preferably thinner than the antireflection films formed on the surfaces of the microlenses above the blue filters.

When the plurality of color filters form a complementary color filter alignment including cyan filters, magenta filters, yellow filters, and green filters, antireflection films, among the plurality of antireflection films, formed on surfaces of microlenses above the magenta filters are preferably thicker than antireflection films, among the plurality of antireflection films, formed on surfaces of microlenses above the cyan filters, and antireflection films, among the plurality of antireflection films, formed on surfaces of microlenses above the yellow filters, and antireflection films, among the plurality of antireflection films, formed on surfaces of microlenses above the green filters.

Further, the antireflection films formed on the surfaces of the microlenses above the green filters are more preferably thinner than the antireflection films formed on the surfaces of the microlenses above the cyan filters, and the antireflection films formed on the surfaces of the microlenses above the yellow filters.

In each of the solid-state image pickup devices described above, surfaces of the plurality of antireflection films may be flat or curved along the surfaces of the portion of the plurality of microlenses, respectively.

Further, antireflection films, among the plurality of antireflection films, formed at a center portion of a pixel area in which the plurality of light reception sections are aligned is thicker than antireflection films, among the plurality of antireflection films, formed in an edge portion of the pixel area.

A third aspect of the present invention is directed to a method for fabricating a solid-state image pickup device comprising a semiconductor substrate, and a plurality of light reception sections aligned on the semiconductor substrate so as to form a matrix. The method comprises: forming a plurality of color filters in a layer above the plurality of light reception sections, respectively; forming a plurality of microlenses in a layer above the plurality of color filters, respectively; applying, to surfaces of the plurality of microlenses, a photosensitive material having a refractive index lower than the plurality of microlenses; and exposing a portion of the photosensitive material by using a photomask, so as to selectively form a plurality of antireflection films on surfaces of a portion of the plurality of microlenses.

In this case, the plurality of antireflection films may be selectively formed on surfaces of microlenses which are formed above color filters, among the plurality of color filters, each having a predetermined spectral characteristic, the microlenses being among the plurality of microlenses.

A fourth aspect of the present invention is directed to a method for fabricating a solid-state image pickup device comprising a semiconductor substrate, and a plurality of light reception sections aligned on the semiconductor substrate so as to form a matrix. The method comprises: forming a plurality of color filters in a layer above the plurality of light reception sections, respectively; forming a plurality of microlenses in a layer above the plurality of color filters, respectively; applying, to surfaces of the plurality of microlenses, a photosensitive material having a refractive index lower than the plurality of microlenses; and exposing the photosensitive material by using a gray scale mask including an area having light transmittances which are determined depending on spectral characteristics of the plurality of color filter, respectively, so as to form a plurality of antireflection films each having a thickness determined for each microlens.

In this case, each of the plurality of antireflection films may have the thickness determined for each of the spectral characteristics of the plurality of color filters.

According to the present invention, the antireflection film is formed on the surface of the microlens based on spectral characteristic of the color filter, and therefore deterioration of characteristic such as sensitivity is suppressed, thereby realizing the solid-state image pickup device capable of improving an image quality.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram illustrating a primary color filter alignment;

FIG. 3 is a diagram illustrating a complementary color filter alignment;

DESCRIPTION OF THE PREFERRED EMBODIMENTS

First Embodiment

Figure 1:
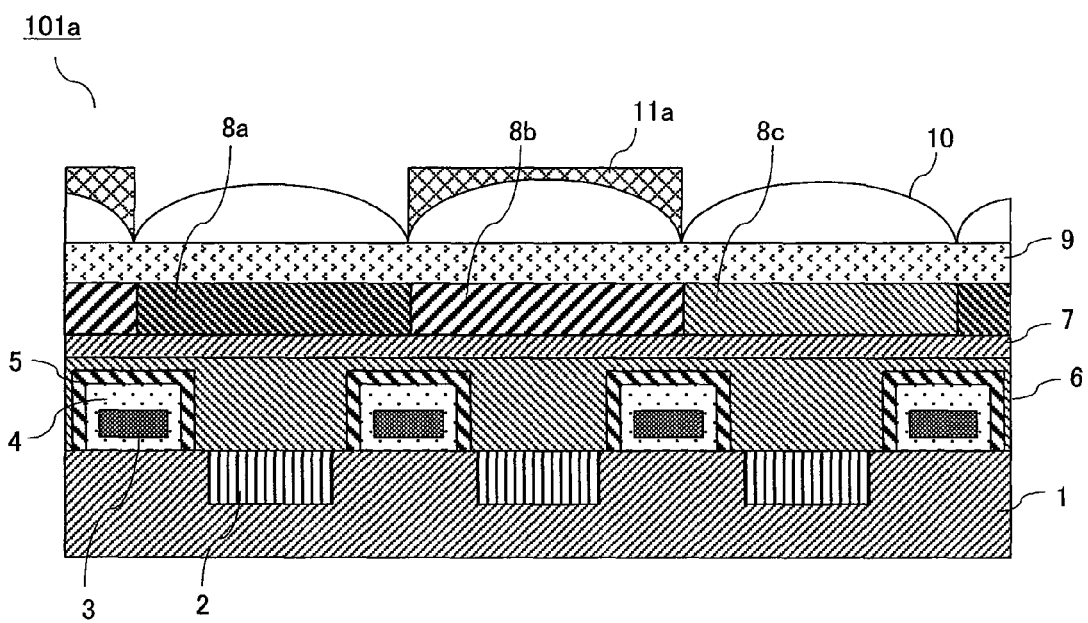
FIG. 1 is a cross-sectional view schematically illustrating a configuration of a CCD solid-state image pickup device according to a first embodiment of the present invention.

FIG. 1 is a cross-sectional view schematically illustrating a configuration of a CCD solid-state image pickup device according to a first embodiment of the present invention. FIG. 2 is a diagram illustrating an alignment of a primary color filter, and FIG. 3 is a diagram illustrating an alignment of a complementary color filter. FIG. 1 shows a cross section along lines A-A of FIG. 2.

The solid-state image pickup device 101a comprises: a semiconductor substrate 1; a plurality of light reception sections 2 forming a matrix on the semiconductor substrate 1; and a plurality of transfer electrodes 3. The plurality of transfer electrodes 3 are provided so as to correspond to columns, respectively, each including the light reception sections 2, and the plurality of transfer electrodes 3 are each used for sequentially transferring, along the direction represented by the corresponding column, electric charges outputted by the light reception sections 2 in the corresponding column. Insulating films 4 insulate the plurality of transfer electrodes 3, respectively, from the semiconductor substrate 1. Further, light-shielding films 5 are provided so as to cover the respective transfer electrodes 3 and the respective insulating films 4 so as to prevent application of lights to the transfer electrodes 3, respectively.

A transparent flattening film 6 made of, for example, transparent acrylic resin, is formed on the light reception sections 2 and the light-shielding films 5 for flattening. A color filter base film 7 made of, for example, transparent acrylic resin is formed on the transparent flattening film 6, and color filters 8a, 8b, and 8c, which are, for example, pigment color filters, are formed on the color filter base film 7.

In the following description, the color filters 8a, 8b, and 8c are aligned as a primary color filter as shown in FIG. 2. The color filters 8a, 8b, and 8c correspond to a green filter G, a red filter R, and a blue filter B, respectively.

A complementary color filter of three colors, cyan, magenta, and yellow or a complementary color filter of four colors, cyan, magenta, yellow, and green as shown in FIG. 3 may be used instead of the primary color filter. When the complementary color filter is used, the color filter 8b shown in FIG. 1 corresponds to a magenta filter Mg.

The upper surface level (not shown) is different among the color filters 8a, 8b, and 8c, depending on the color, and therefore a flattening film 9 is provided on the color filters 8a, 8b, and 8c so as to eliminate the difference in upper surface level and flatten the upper surfaces. A plurality of microlenses 10 are provided on the flattening film 9 so as to correspond to the color filters 8a, 8b, and 8c, respectively. Each microlens 10 is made of, for example, acrylic positive photosensitive resin.

An antireflection film 11a is selectively formed on the surface of the microlens for the red color filter 8b. In the present embodiment, the surface of the antireflection film 11a is flattened.

When the solid-state image pickup device 101a is mounted in a hollow package, a layer of gas is formed on the surfaces of the microlenses 10 and the antireflection film 11a. Alternatively, when a sealing glass is adhered to the solid-state image pickup device 101a, an adhering layer including an adhesive is provided on the surfaces of the microlenses 10 and the antireflection film 11a.

As described above, the solid-state image pickup device 101a of the present embodiment has characteristic that the antireflection film 11a is formed on the surface of the microlens only for the red color filter 8b, and the antireflection film is not formed on the surfaces of the microlenses for the green color filter 8a and the blue color filter 8c. The antireflection film is provided for a red pixel only as described above because red color smear characteristic has the greatest influence of entire smear characteristics. Further, the antireflection film is not formed for a pixel of another color because sensitivity characteristic is a higher priority.

Figure 4:
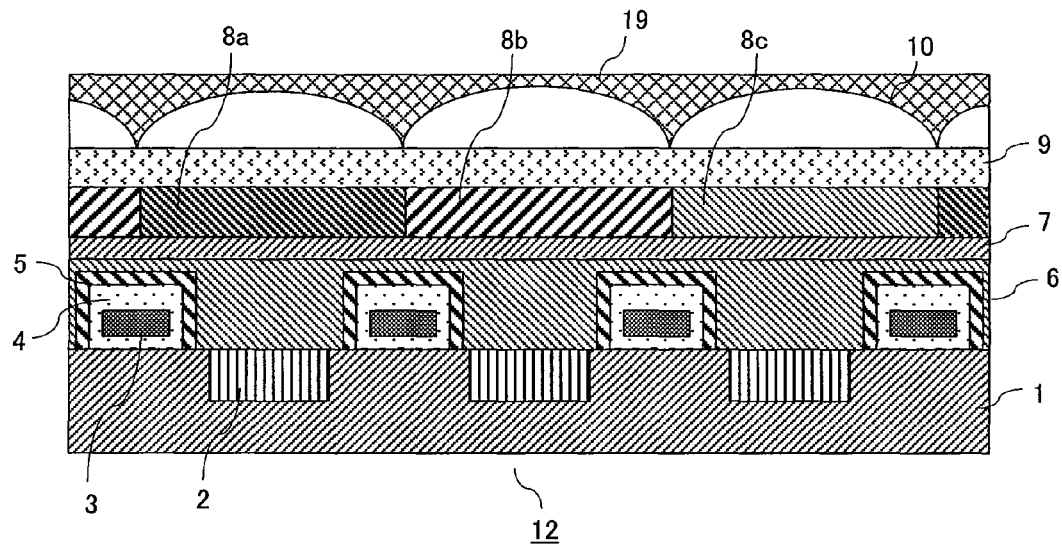
FIG. 4 is a diagram schematically illustrating process steps of a method for fabricating the solid-state image pickup device according to the first embodiment of the present invention.
Figure 5:
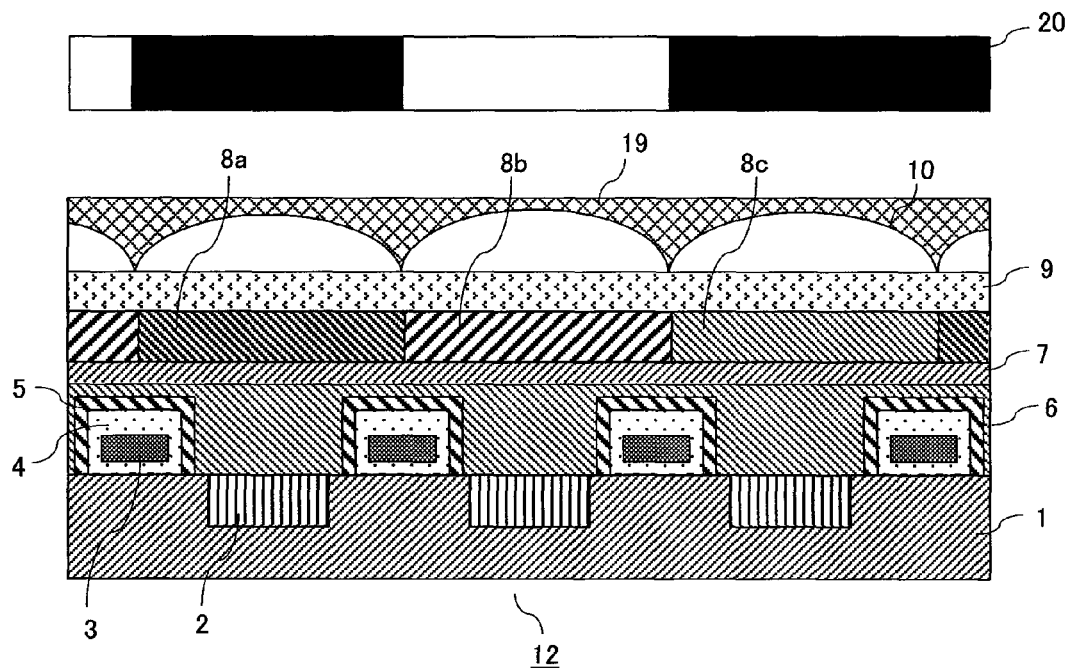
FIG. 5 is a diagram illustrating process steps following the process steps shown in FIG. 4.

FIG. 4 is a diagram schematically illustrating process steps of a method for fabricating the solid-state image pickup device according to the first embodiment of the present invention, and FIG. 5 is a diagram illustrating process steps following the process steps shown in FIG. 4.

Firstly, the color filters 8a, 8b, and 8c are formed in a layer above the plurality of light reception sections 2, respectively, and the microlenses 10 are formed in a layer above the color filters 8a, 8b, and 8c, respectively. Methods for forming the color filters 8a, 8b, and 8c, and the microlenses 10 are not limited to any specific methods, and the color filters 8a, 8b, and 8c, and the microlenses 10 may be formed in any applicable methods. Further, the light reception sections 2, the transfer electrodes 3, the insulating films 4, the light-shielding films 5, the transparent flattening film 6, the color filter base film 7, and the flattening film 9 may be formed in any applicable methods.

Next, as shown in FIG. 4, negative photosensitive material 19 having a refractive index lower than a refractive index of the microlens 10 is applied to a wafer 12 having the microlenses 10 formed therein by rotating the wafer 12. After the negative photosensitive material 19 is applied to the rotating wafer 12, a solvent contained in the applied photosensitive material is volatilized.

As shown in FIG. 5, ultraviolet exposure process is performed by using a photomask 20 having patterns each of which passes a light therethrough at a position corresponding to the red color filter 8b. Thereafter, development process is performed so as to selectively form the antireflection film 11a on the surface of the microlens above the red color filter 8b as shown in FIG. 1.

In the method for fabricating the solid-state image pickup device according to the present embodiment, it is possible to form, by using the spin coating method, a coating film on one surface of the wafer 12 such that the coating film has uniform thickness, and therefore the soiling on a device due to a photosensitive material adhering to the back surface of the wafer 12 can be prevented.

As described above, in the solid-state image pickup device according to the present embodiment, an antireflection film is selectively formed on the surface of the microlens for a color filter having a predetermined spectral characteristic, and therefore it is possible to improve sensitivity characteristic, smear characteristic, color mixture characteristic, and S/N ratio for each spectral characteristic of the color filter.

Although in the above description the present invention is applied to the CCD solid-state image pickup device 101a, the present invention may be applied to a MOS solid-state image pickup device. Hereinafter, an exemplary case where the present invention is applied to a MOS solid-state image pickup device will be described.

Figure 6:
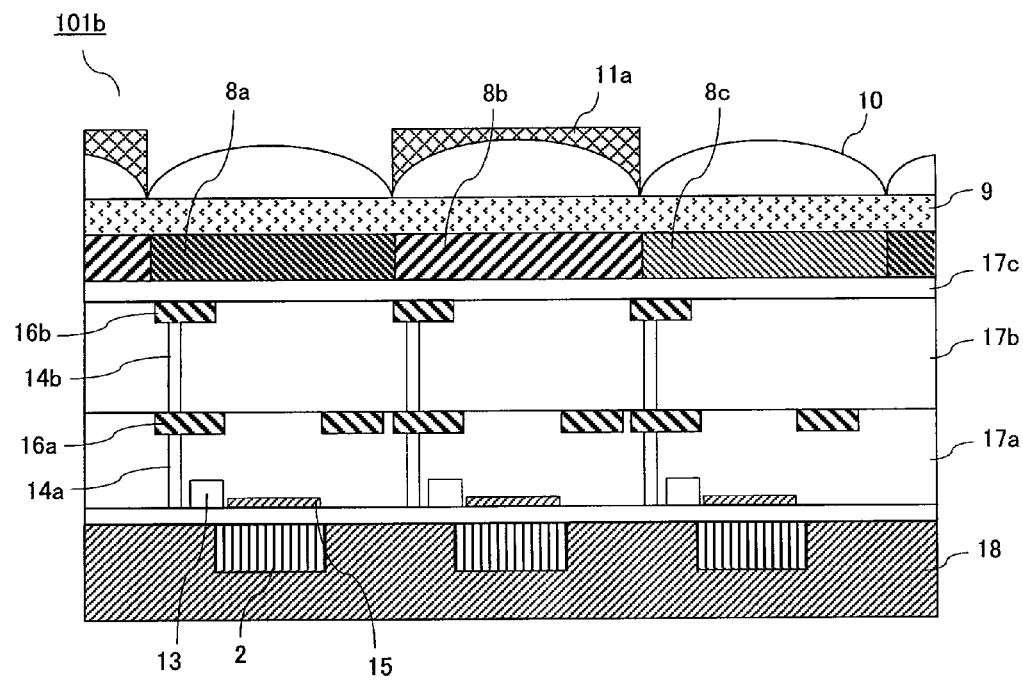
FIG. 6 is a cross-sectional view schematically illustrating a configuration of a MOS solid-state image pickup device according to the first embodiment of the present invention.

FIG. 6 is a cross-sectional view schematically illustrating a configuration of a MOS solid-state image pickup device according to the first embodiment of the present invention.

The solid-state image pickup device 101b comprises: a semiconductor substrate 18; a plurality of light reception sections 2 forming a matrix on the semiconductor substrate 18; a plurality of reading gates 13 for reading electric charges accumulated in the plurality of light reception sections 2, respectively; a plurality of antireflection laminate films 15 formed above the plurality of light reception sections 2, respectively; wirings 16a and wirings 16b formed in layers, respectively, different from each other; and layer insulating films 17a, 17b, and 17c for insulating the wirings 16a and the wirings 16b. Further, conducive plugs 14a connect the wirings 16a to electrodes (not shown), respectively, and the like provided on the semiconductor substrate 18, and conductive plugs 14b connect between the wirings 16a and the wirings 16b, respectively.

The color filters 8a, 8b, and 8c, the flattening film 9, and the microlenses 10, all of which are the same as shown in FIG. 1, are provided on the layer insulating film 17c, and the antireflection film 11a is selectively formed on the surface of the microlens for the red color filter 8b.

As shown in FIG. 6, multilayer wirings are often formed over two or more layers in the MOS solid-state image pickup device (CMOS sensor). In this case, the MOS solid-state image pickup device has a longer distance between the light reception section 2 and the microlens 10 corresponding thereto than a distance therebetween in the CCD solid-state image pickup device, and therefore reduction of light collection efficiency and/or color mixture are likely to occur. Therefore, when the present invention is applied to the MOS solid-state image pickup device, an effect of reducing deterioration such as color mixture noise is enhanced as compared to a case where the present invention is applied to the CCD solid-state image pickup device.

Further, in the solid-state image pickup devices 101a and 101b according to the present embodiment, the thickness of the antireflection film 11a may vary in accordance with a position in a pixel area in which the plurality of light reception sections 2 are provided. Hereinafter, this case will be described.

Figure 7:
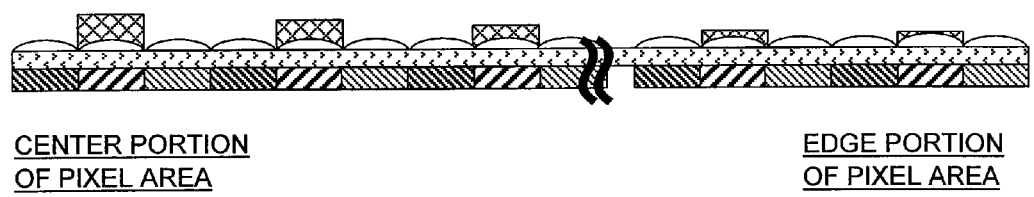
FIG. 7 is a diagram illustrating a relationship between a thickness of an antireflection film and a distance from the center of a pixel area.

FIG. 7 is a diagram illustrating a relationship between the thickness of the antireflection film and a distance from the center of the pixel area. FIG. 7 schematically shows a cross section, of the solid-state image pickup device, extending from the center portion of the pixel area to the edge portion thereof.

In an example shown in FIG. 7, the thickness of the antireflection film 11a is greatest at the center portion of the pixel area, and the thickness thereof is reduced toward the edge portion of the pixel area from the center portion thereof. In general, an amount of light incident on the edge portion of the pixel area may be smaller than an amount of light incident on the center portion of the pixel area. As in an example shown in FIG. 7, by adjusting the thickness of the antireflection film, light absorption performed by the antireflection film 11a itself can be reduced in accordance with the distance from the center portion of the pixel area, thereby enabling reduction of difference in sensitivity among pixels.

The antireflection films 11a shown in FIG. 7 can be formed by using, for example, a gray scale mask when a photosensitive material is exposed. Patterns having light transmittances, respectively, are formed at positions, on the gray scale mask, corresponding to pixels in which the antireflection films 11a are to be formed such that the light transmittances depend on the thicknesses of the antireflection film 11a.

Second Embodiment

Figure 8:
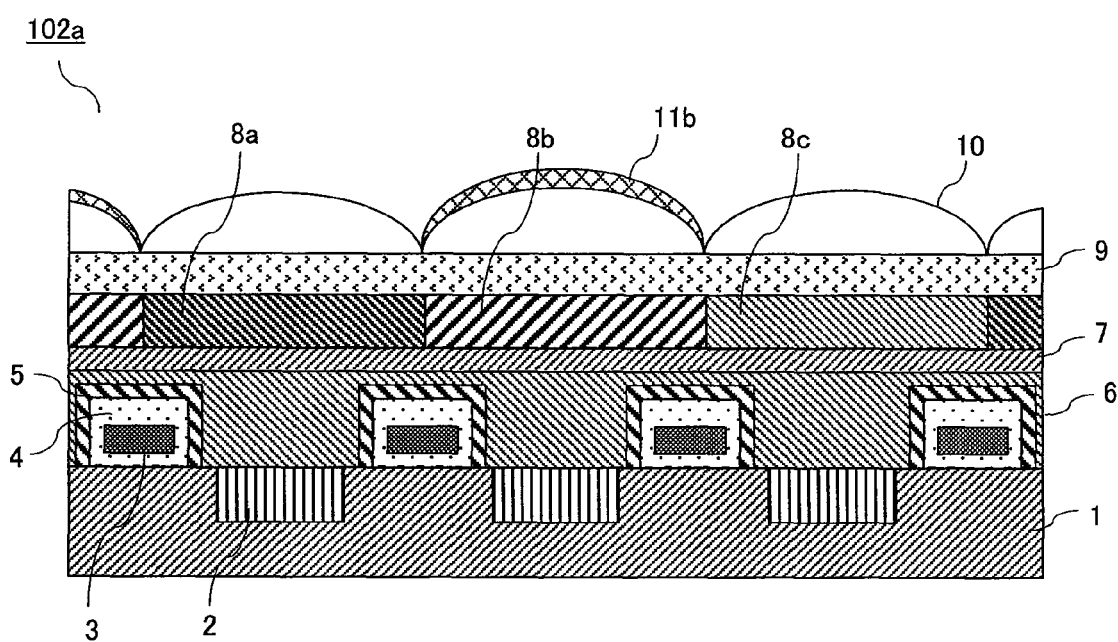
FIG. 8 is a cross-sectional view schematically illustrating a configuration of a CCD solid-state image pickup device according to a second embodiment of the present invention.

FIG. 8 is a cross-sectional view schematically illustrating a configuration of a CCD solid-state image pickup device according to a second embodiment of the present invention.

A fundamental configuration of a solid-state image pickup device 102a according to the present embodiment is the same as that of the solid-state image pickup device 101a shown in FIG. 1. Further, also in the present embodiment, the antireflection film 11b is selectively formed on the surface of the microlens for the red color filter 8b as in the first embodiment. However, the antireflection film 11b according to the present embodiment is different from the antireflection film 11a according to the first embodiment in that the antireflection film 11b has a surface curved along the microlens 10.

As shown in FIG. 8, by curving the antireflection film 11b along the surface of the microlens 10, the antireflection film 11b is allowed to absorb a light almost uniformly regardless of a direction from and a position at which a light is incident on the microlens 10.

Figure 9:
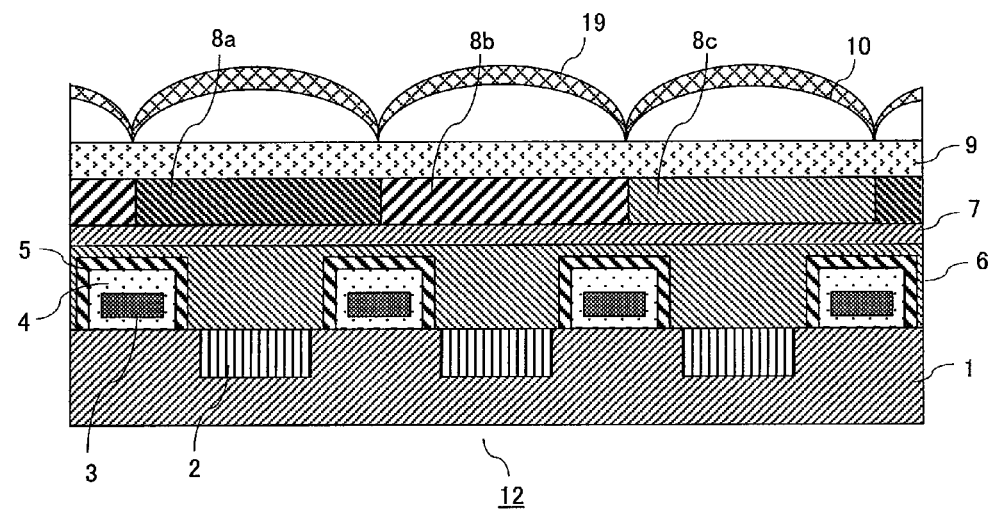
FIG. 9 is a diagram schematically illustrating process steps of a method for fabricating the solid-state image pickup device according to the second embodiment of the present invention.
Figure 10:
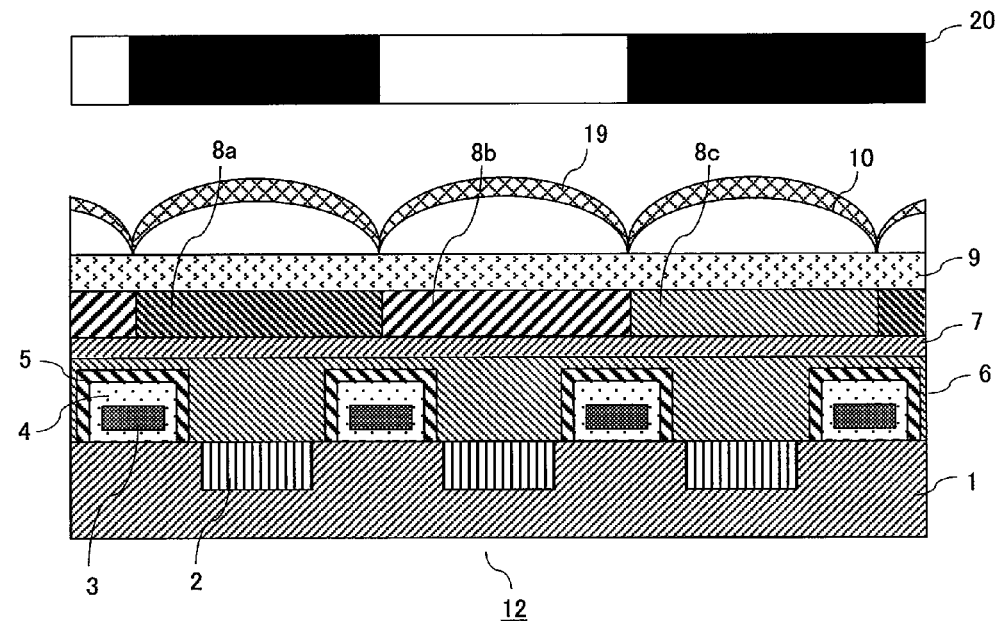
FIG. 10 is a diagram illustrating process steps following the process steps shown in FIG. 9.

FIG. 9 is a diagram schematically illustrating process steps of a method for fabricating the solid-state image pickup device according to the second embodiment of the present invention, and FIG. 10 is a diagram illustrating process steps following the process steps shown in FIG. 9.

Firstly, as shown in FIG. 9, while the wafer 12 in which the color filters 8a, 8b, and 8c, and the microlenses 10 are formed is being rotated, photosensitive material having a refractive index lower than a refractive index of the microlens 10 is dropped on and applied to the rotating wafer 12. By previously adding a solvent to the photosensitive material to be applied, viscosity is reduced, as compared to the photosensitive material used for the first embodiment, so as to form a film along the surface of the microlens 10. After the photosensitive material is applied to the rotating wafer 12, a solvent contained in the applied photosensitive material is volatilized.

As shown in FIG. 10, ultraviolet exposure process is performed by using the photomask 20 having patterns each of which passes a light therethrough at a position corresponding to the red color filter 8b. Thereafter, development process is performed so as to selectively form the antireflection film 11b along the surface of the microlens above the red color filter 8b as shown in FIG. 8.

Figure 11:
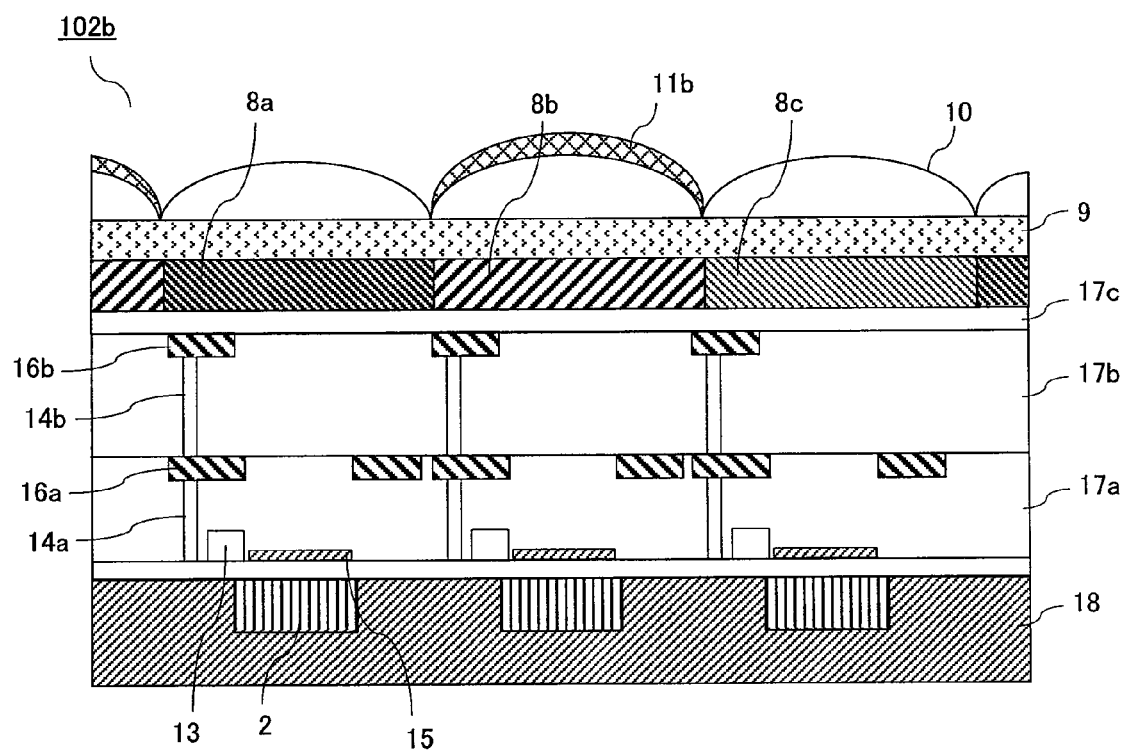
FIG. 11 is a cross-sectional view schematically illustrating a configuration of a MOS solid-state image pickup device according to the second embodiment of the present invention.

FIG. 11 is a cross-sectional view schematically illustrating a configuration of a MOS solid-state image pickup device according to the second embodiment of the present invention.

Although in the above description the present invention is applied to the CCD solid-state image pickup device 102a, the present invention may be applied to a MOS solid-state image pickup device 102b as shown in FIG. 11. Multilayer wirings are often formed over two or more layers in the MOS solid-state image pickup device (CMOS sensor). In this case, the MOS solid-state image pickup device has a longer distance between the light reception section 2 and the microlens 10 corresponding thereto than a distance therebetween in the CCD solid-state image pickup device. However, it is possible to reduce deterioration such as color mixture noise by applying the present invention to the MOS solid-state image pickup device.

As described above, in the solid-state image pickup devices 102a and 102b according to the present embodiment, light absorption performed by the antireflection film 11b can be suppressed, and therefore it is possible to improve sensitivity characteristic, smear characteristic, color mixture noise characteristic, and S/N ratio.

Third Embodiment

Figure 12:
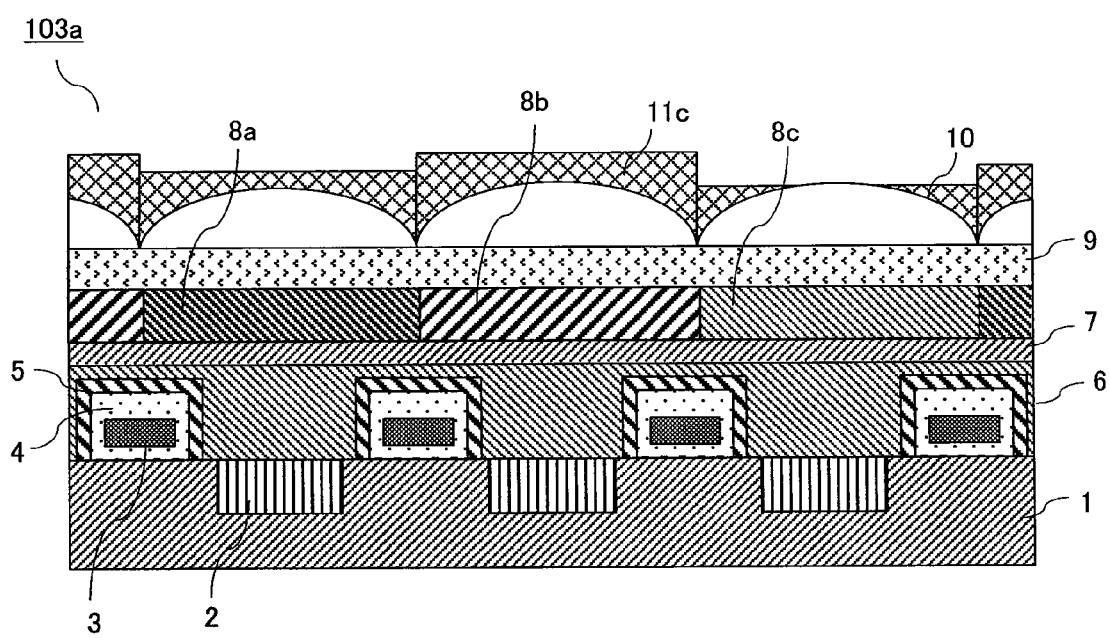
FIG. 12 is a cross-sectional view schematically illustrating a configuration of a CCD solid-state image pickup device according to a third embodiment of the present invention.

FIG. 12 is a cross-sectional view schematically illustrating a configuration of a CCD solid-state image pickup device according to a third embodiment of the present invention.

A fundamental configuration of a solid-state image pickup device 103a according to the present embodiment is the same as that of the solid-state image pickup device 101a shown in FIG. 1. However, in the present embodiment, the antireflection films 11c are formed on the microlenses 10 for the blue color filter 8a and the green color filter 8c in addition to the microlens 10 for the red color filter 8b.

The thickness of the antireflection film 11c is determined so as to correspond to each spectral characteristic of the color filters 8a, 8b, and 8c. Specifically, when a primary color filter including a red filter, a green filter, and a blue filter is used, the antireflection film 11c of the red filter has the greatest thickness among the antireflection films of all the filters, and the antireflection film 11c of the green filter has the smallest thickness among the antireflection films of all the filters. Further, when a complementary color filter including a cyan filter, a magenta filter, and a yellow filter is used, the antireflection film 11c of the magenta filter has the greatest thickness among the antireflection films of all the filters. Furthermore, when the complementary color filter including a green filter in addition to the cyan, magenta, and yellow filters is used, the antireflection film 11c of the green filter has the smallest thickness among the antireflection films of all the filters.

According to the present embodiment, the antireflection film 11c of the microlens 10 for the red (magenta) filter has the greatest thickness among the antireflection films of all the filters because influence of red smear characteristic is greatest among entire smear characteristics. On the other hand, the antireflection film 11c of the microlens 10 for the green filer has a reduced thickness because green sensitivity characteristic is a higher priority so as to improve resolution performance.

Figure 13:
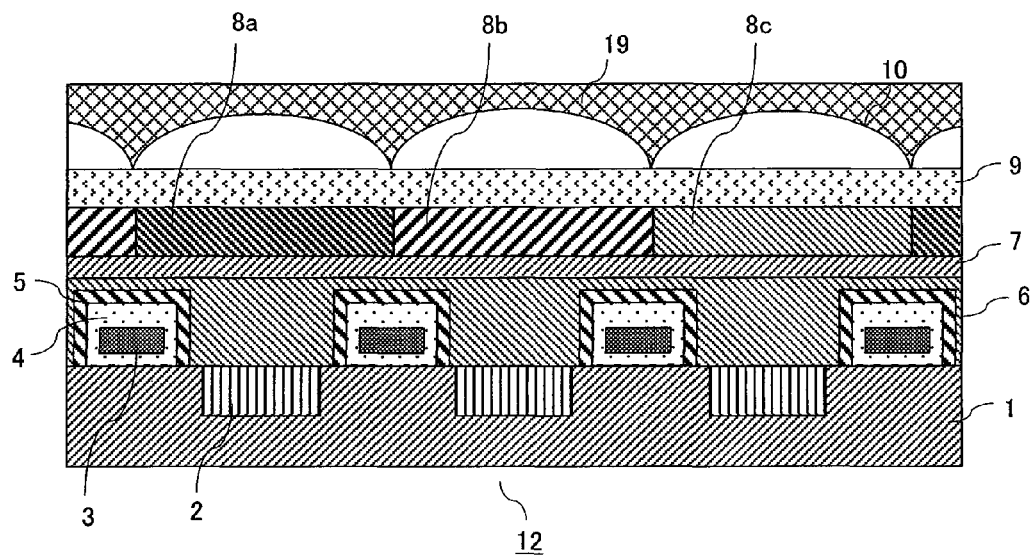
FIG. 13 is a diagram schematically illustrating process steps of a method for fabricating the solid-state image pickup device according to the third embodiment of the present invention.
Figure 14:
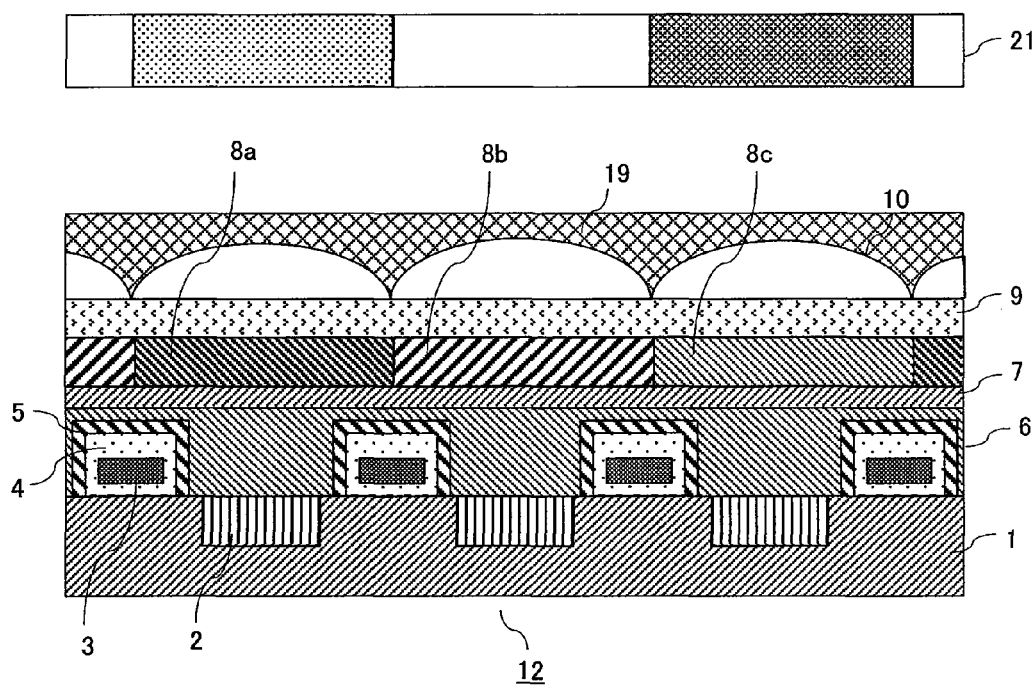
FIG. 14 is a diagram illustrating process steps following the process steps shown in FIG. 13.

FIG. 13 is a diagram schematically illustrating process steps of a method for fabricating the solid-state image pickup device according to the third embodiment of the present invention, and FIG. 14 is a diagram illustrating process steps following the process steps shown in FIG. 13.

Firstly, as shown in FIG. 13, while the wafer in which the color filters 8a, 8b, and 8c, and the microlenses 10 are formed is being rotated, photosensitive material having a refractive index lower than a refractive index of the microlens 10 is dropped onto and applied to the rotating wafer. After the photosensitive material is applied to the rotating wafer, a solvent contained in the applied photosensitive material is volatilized.

Next, as shown in FIG. 14, ultraviolet exposure process is performed by using a gray scale mask 21. The gray scale mask 21 is a combination of a plurality of patterns having light transmittances, respectively, different from each other. The plurality of patterns are positioned so as to correspond to the positions of the color filters 8a, 8b, and 8c, respectively. Specifically, the pattern corresponding to the color filter 8b has the greatest light transmittance of all the patterns, and the pattern corresponding to the color filter 8c has the smallest light transmittance of all the patterns.

A method for fabricating the gray scale mask 21 is not limited to any specific method. As an example, the following fabrication method may be used. Firstly, a plurality of patterns having different darknesses from each other are printed on a transparent sheet so as to produce an original drawing of the gray scale mask 21. The darkness is represented by black dots being roughly positioned. The roughness of the black dots is determined for each pattern based on a required light transmittance. Next, the produced original drawing is scaled down and transferred to a photographic sensitive material by using a reduction projection optical system. In this case, an image of dots of the original drawing is blurred by adjusting a scale-down rate used by the optical system so as to average out the concentration of the dots. Through the process steps described above, it is possible to fabricate the gray scale mask 21 including areas having light transmittances which are different from each other depending on the spectral characteristic of the color filter.

Following the exposure process, development process is performed. Through the development process, as shown in FIG. 12, it is possible to form the antireflection films 11c having the thickness which varies depending on the spectral characteristics of the color filters 8a, 8b, and 8c.

As described above, in the solid-state image pickup device 103a according to the present embodiment, the thickness of the antireflection film 11c can be changed for each microlens 10 so as to correspond to the pattern in which the color filters 8a, 8b, and 8c are aligned. As a result, light absorption performed by the antireflection film 11c can be adjusted so as to correspond to each spectral characteristic of the color filters 8a, 8b, and 8c, and therefore it is possible to improve the sensitivity characteristic, the smear characteristic, color mixture noise characteristic, and S/N ratio, with enhanced accuracy, based on the spectral characteristic.

Figure 15:
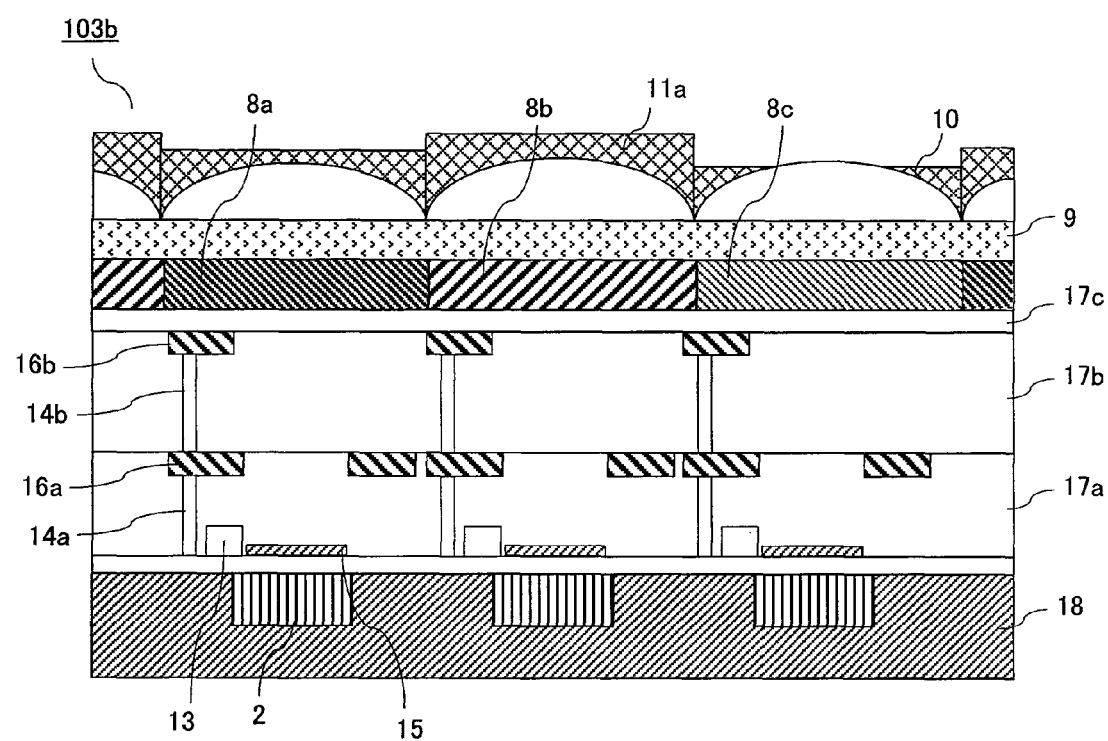
FIG. 15 is a cross-sectional view schematically illustrating a configuration of a MOS solid-state image pickup device according to the third embodiment of the present invention.
Figure 16:
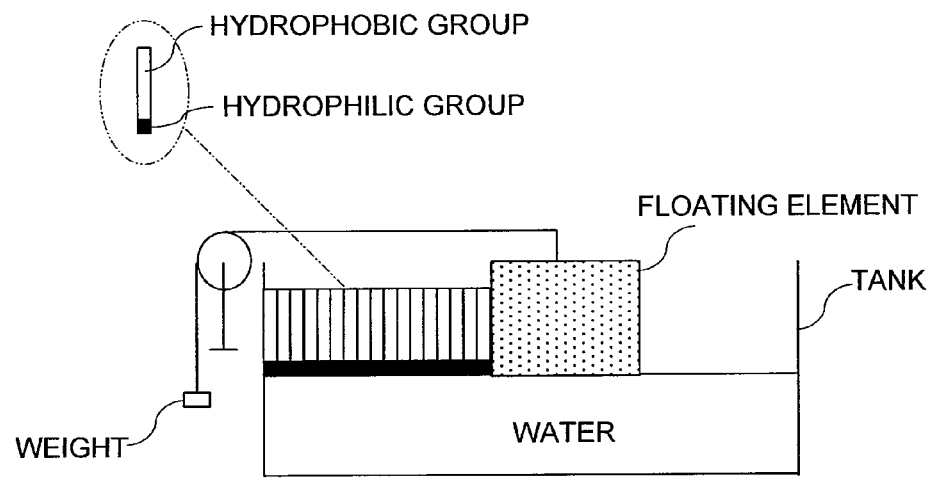
FIG. 16 is a diagram illustrating process steps of a conventional LB method.
Figure 17:
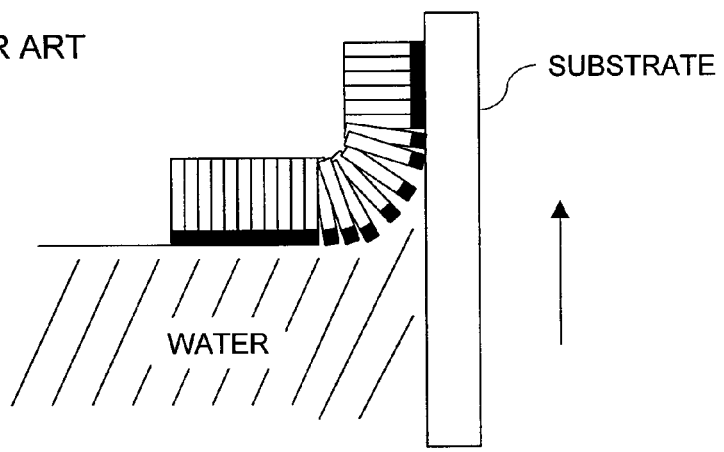
FIG. 17 is a diagram illustrating process steps following the process steps shown in FIG. 16.
Figure 18:
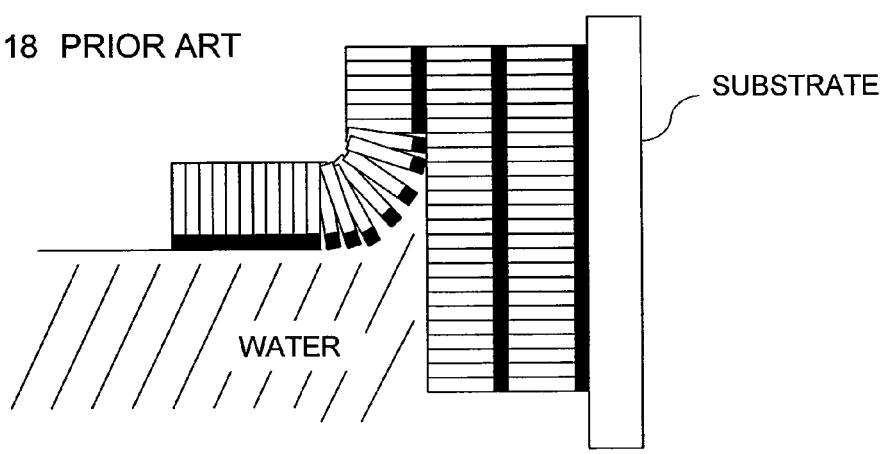
FIG. 18 is a diagram illustrating process steps following the process steps shown in FIG. 17.
Figure 19:
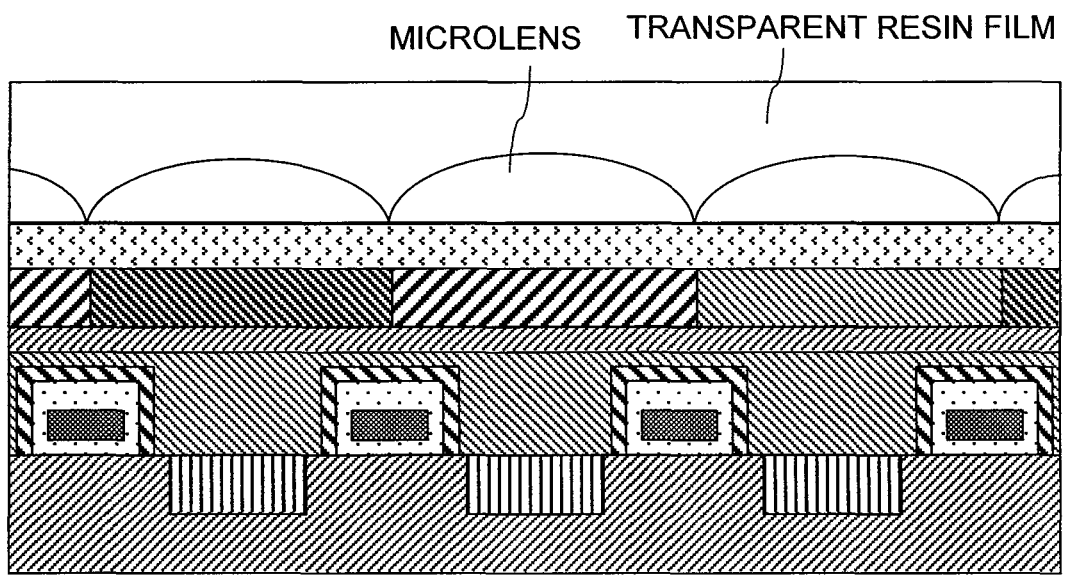
FIG. 19 is a cross-sectional view of a conventional solid-state image pickup device.

FIG. 15 is a cross-sectional view schematically illustrating a configuration of a MOS solid-state image pickup device according to the third embodiment of the present invention.

Although in the above description the present invention is applied to the CCD solid-state image pickup device 103a, the present invention may be applied to a MOS solid-state image pickup device 103b as shown in FIG. 15. Multilayer wirings are often formed over two or more layers in the MOS solid-state image pickup device (CMOS sensor). In this case, the MOS solid-state image pickup device has a longer distance between the light reception section 2 and the microlens 10 corresponding thereto than a distance therebetween in the CCD solid-state image pickup device. However, it is possible to reduce deterioration such as color mixture noise by applying the present invention to the MOS solid-state image pickup device.

(Another Exemplary Modification)

In each of the first to the third embodiments, an interlayer lens (second microlens) may be further provided between the light reception section and the microlens.

Further, although in the first to the third embodiments, the antireflection film is made of negative photosensitive material, the antireflection film may be made of positive photosensitive material (resist). When the positive photosensitive material is used, a light-shielding area and a light transmission area are reversed on the photomask or the gray scale mask from those of the negative photosensitive material, thereby forming the antireflection film in the same manner as that for the negative photosensitive material.

Further, although, in the first to the third embodiments described above, the method for forming the antireflection film for the CCD solid-state image pickup device is described, it should be understood that the method for forming the antireflection film may be similarly applied to the MOS solid-state image pickup device.

Further, in the first to the third embodiments, when it is necessary to adhere a component such as glass to the surface of the solid-state image pickup device, an adhesive made of transparent organic compound such as acrylic resin may be used to adhere the component to the microlens and the anti-reflection film.

Moreover, the positioning of the antireflection film as described in each of the first to the third embodiments may be determined based on the performance required for the solid-state image pickup device. For example, when a high priority is placed on the sensitivity characteristic, the antireflection film may be selectively formed so as to correspond to only the color filter of a specific color as described in the first and the second embodiments.

Further, although in the first to the third embodiments whether or not the antireflection film is to be provided and the thickness of the antireflection film are determined for each spectral characteristic of the color filter, it is possible to form the antireflection film having a desired thickness at any position (that is, on any microlens) in a pixel area by changing the mask pattern in the method for forming the antireflection film according to the present invention. Whether or not the antireflection film is to be provided and the thickness of the antireflection film may be determined based on characteristic of an incident light obtained at a position, in the pixel area, of each light reception section, instead of the spectral characteristic of the color filter.

Further, the method for forming the antireflection film according to the first to the third embodiments may be applied to a microlens incorporated in a liquid crystal projector, an optical communication connector, and the like.

Further, although in the first and the second embodiments the antireflection films are selectively formed on all the red or magenta color filters, the antireflection films may be selectively formed on the color filter of another color. Moreover, the antireflection films may be provided so as to correspond to a portion of the color filters having a certain spectral characteristic. Furthermore, also in the third embodiment, the antireflection films may be formed on only a portion of pixels.

Further, in the second and the third embodiments, the antireflection film may have greater thickness in the center portion of the pixel area than in the edge portion thereof as in the first embodiment (FIG. 7). In this case, for example, by changing the light transmittances of the respective light transmission areas formed on the gray scale mask, the antireflection film has greater thickness in the center portion of the pixel area than in the edge portion thereof. In this case, as in the example shown in FIG. 7, it is possible to reduce a difference, in sensitivity among pixels, based on a distance from the center potion of the pixel area.

Furthermore, also in the third embodiment, as described in the second embodiment, the antireflection film may be curved along the surface of the microlens.

While the invention has been described in detail, the foregoing description is in all aspects illustrative and not restrictive. It is understood that numerous other modifications and variations can be devised without departing from the scope of the invention.

What is claimed is:

1. A solid-state image pickup device, comprising:
   a semiconductor substrate;
   a plurality of light reception sections aligned on the semiconductor substrate so as to form a matrix;
   a plurality of color filters formed above the plurality of light reception sections, respectively;
   a plurality of microlenses formed above the plurality of color filters, respectively; and
   a plurality of antireflection films selectively formed on surfaces of a portion of the plurality of microlenses,
   wherein the plurality of antireflection films are selectively formed on surfaces of microlenses which are formed above color filters, among the plurality of color filters, each having a predetermined spectral characteristic, the microlenses being among the plurality of microlenses.

2. The solid-state image pickup device according to claim 1, wherein surfaces of the plurality of antireflection films are flat.

3. The solid-state image pickup device according to claim 1, wherein surfaces of the plurality of antireflection films are curved along the surfaces of the portion of the plurality of microlenses, respectively.

4. The solid-state image pickup device according to claim 1, wherein antireflection films, among the plurality of antireflection films, formed at a center portion of a pixel area in which the plurality of light reception sections are aligned is thicker than antireflection films, among the plurality of antireflection films, formed in an edge portion of the pixel area.

5. The solid-state image pickup device according to claim 1,
   wherein the plurality of color filters form a primary color filter alignment including red filters, green filters, and blue filters, and
   wherein the plurality of antireflection films are formed on the surfaces of the microlenses above the red filters, respectively.

6. The solid-state image pickup device according to claim 1,
   wherein the plurality of color filters form a complementary color filter alignment including cyan filters, magenta filters, yellow filters, and green filters, and
   wherein the plurality of antireflection films are formed on the surfaces of the microlenses above the magenta filters, respectively.

7. A solid-state image pickup device, comprising:
a semiconductor substrate;
a plurality of light reception sections aligned on the semiconductor substrate so as to form a matrix;
a plurality of color filters formed above the plurality of light reception sections, respectively;
a plurality of microlenses formed above the plurality of color filters, respectively; and
a plurality of antireflection films formed on surfaces of the plurality of microlenses, respectively, the plurality of antireflection films each having a thickness determined for each microlens.

8. The solid-state image pickup device according to claim 7, wherein surfaces of the plurality of antireflection films are flat.

9. The solid-state image pickup device according to claim 7, wherein surfaces of the plurality of antireflection films are curved along the surfaces of the plurality of microlenses, respectively.

10. The solid-state image pickup device according to claim 7, wherein antireflection films, among the plurality of antireflection films, formed at a center portion of a pixel area in which the plurality of light reception sections are aligned is thicker than antireflection films, among the plurality of antireflection films, formed in an edge portion of the pixel area.

11. The solid-state image pickup device according to claim 7, wherein the thickness of each antireflection film depends on a spectral characteristic of a corresponding one of the plurality of color filters.

12. The solid-state image pickup device according to claim 11,
wherein the plurality of color filters form a primary color filter alignment including red filters, green filters, and blue filters, and
wherein antireflection films, among the plurality of antireflection films, formed on surfaces of microlenses above the red filters are thicker than antireflection films, among the plurality of antireflection films, formed on surfaces of microlenses above the blue filters, and antireflection films, among the plurality of antireflection films, formed on surfaces of microlenses above the green filters.

13. The solid-state image pickup device according to claim 12, wherein the antireflection films formed on the surfaces of the microlenses above the green filters are thinner than the antireflection films formed on the surfaces of the microlenses above the blue filters.

14. The solid-state image pickup device according to claim 11,
wherein the plurality of color filters form a complementary color filter alignment including cyan filters, magenta filters, yellow filters, and green filters, and
wherein antireflection films, among the plurality of antireflection films, formed on surfaces of microlenses above the magenta filters are thicker than antireflection films, among the plurality of antireflection films, formed on surfaces of microlenses above the cyan filters, and antireflection films, among the plurality of antireflection films, formed on surfaces of microlenses above the yellow filters, and antireflection films, among the plurality of antireflection films, formed on surfaces of microlenses above the green filters.

15. The solid-state image pickup device according to claim 14, wherein the antireflection films formed on the surfaces of the microlenses above the green filters are thinner than the antireflection films formed on the surfaces of the microlenses above the cyan filters, and the antireflection films formed on the surfaces of the microlenses above the yellow filters.

* * * * *